(12) United States Patent
Do

(10) Patent No.: US 7,843,749 B2
(45) Date of Patent: *Nov. 30, 2010

(54) MULTI-PORT MEMORY DEVICE WITH SERIAL INPUT/OUTPUT INTERFACE

(75) Inventor: Chang-Ho Do, Kyoungki-Do (KR)

(73) Assignee: Hynix Semiconductor Inc. (KR)

( * ) Notice: Subject to any disclaimer, the term of this patent is extended or adjusted under 35 U.S.C. 154(b) by 17 days.

This patent is subject to a terminal disclaimer.

(21) Appl. No.: 12/287,794

(22) Filed: Oct. 14, 2008

(65) Prior Publication Data

US 2009/0086558 A1    Apr. 2, 2009

Related U.S. Application Data

(63) Continuation of application No. 11/541,206, filed on Sep. 28, 2006, now Pat. No. 7,443,760.

(30) Foreign Application Priority Data

Sep. 29, 2005   (KR) ............... 2005-0090916
Apr. 11, 2006   (KR) ............... 2006-0032947

(51) Int. Cl.
*G11C 7/00* (2006.01)
(52) U.S. Cl. .................. 365/201; 365/230.06
(58) Field of Classification Search .......... 365/201, 365/230.06
See application file for complete search history.

(56) References Cited

U.S. PATENT DOCUMENTS

| | | | | |
|---|---|---|---|---|
| 4,698,588 A * | 10/1987 | Hwang et al. | ............... | 324/73.1 |
| 4,710,933 A * | 12/1987 | Powell et al. | ............... | 714/730 |
| 4,890,224 A * | 12/1989 | Fremont | ............... | 710/11 |
| 5,796,745 A | 8/1998 | Adams et al. | | |
| 6,070,256 A | 5/2000 | Wu et al. | | |
| 6,557,127 B1 | 4/2003 | Adams et al. | | |
| 6,681,358 B1 | 1/2004 | Karimi et al. | | |
| 7,035,228 B2 * | 4/2006 | Baumer | ............... | 370/258 |
| 2004/0006727 A1 | 1/2004 | Adams et al. | | |
| 2005/0251713 A1 | 11/2005 | Lee | | |
| 2006/0015314 A1 * | 1/2006 | Roesner et al. | ............... | 703/22 |
| 2007/0070743 A1 * | 3/2007 | Do et al. | ............... | 365/201 |
| 2007/0070795 A1 * | 3/2007 | Do | ............... | 365/233 |

FOREIGN PATENT DOCUMENTS

| | | |
|---|---|---|
| JP | 2001-296337 | 10/2001 |
| KR | 1999-0066596 | 8/1999 |
| KR | 10-2005-0022855 | 3/2005 |
| KR | 10-2005-0106902 | 11/2005 |
| KR | 10-2005-0106912 | 11/2005 |
| TW | 200421079 | 10/2004 |

* cited by examiner

*Primary Examiner*—Michael T Tran
(74) *Attorney, Agent, or Firm*—Blakely, Sokoloff, Taylor & Zafman

(57) ABSTRACT

A multi-port memory device includes a plurality of serial I/O data pads; a plurality of parallel I/O data pads; a plurality of first ports for performing a serial I/O data communication with external devices through the serial I/O data pads; a plurality of banks for performing a parallel I/O data communication with the first ports via a plurality of first data buses; and a second port for performing a parallel I/O data communication with the external devices through the parallel I/O data pads and a serial I/O data communication with the first ports via a plurality of second data buses, during a test mode.

57 Claims, 12 Drawing Sheets

MULTI-PORT MEMORY DEVICE WITH SERIAL INPUT/OUTPUT INTERFACE

The present patent application is a Continuation of application Ser. No. 11/541,206, filed Sep. 28, 2006 now U.S. Pat. No. 7,443,760.

FIELD OF THE INVENTION

The present invention relates to a multi-port memory device, and more particularly, to a test interface of a multi-port memory device with a serial input/output (I/O) interface for processing a multiple concurrent operation with external devices.

DESCRIPTION OF RELATED ARTS

Generally, most memory devices including random access memory (RAM) have a single port with a plurality of input/output pin sets. That is, the single port is provided for data exchange between a memory device and an external chipset. Such a memory device having the single port uses a parallel input/output (I/O) interface to simultaneously transmit multi-bit data through signal lines connected to a plurality of input/output (I/O) pins. The memory device exchanges data with the external device through a plurality of I/O pins in parallel.

The I/O interface is an electrical and mechanical scheme to connect unit devices having different functions through signal lines and transmit transmission/reception data precisely. An I/O interface, described below, must have the same precision. The signal line is a bus to transmit an address signal, a data signal, and a control signal. A signal line, described below, will be referred to as a bus.

The parallel I/O interface has high data processing efficiency (speed) because it can simultaneously transmit multi-bit data through a plurality of buses. Therefore, the parallel I/O interface is widely used in a short distance transmission that requires a high speed. In the parallel I/O interface, however, the number of buses for transmitting I/O data increases. Consequently, as distance increases, the manufacturing cost increases. Due to the limitation of the single port, a plurality of memory devices are independently configured so as to support various multi-media functions in terms of hardware of a multi-media system. While an operation for a certain function is carried out, an operation for another function cannot be concurrently carried out.

Considering the disadvantage of the parallel I/O interface, many attempts to change the parallel I/O interface into serial I/O interface have been made. Also, considering compatible expansion with devices having other serial I/O interfaces, the change to serial I/O interface in an I/O environment of the semiconductor memory device is required. Moreover, appliance devices for audio and video are embedded into display devices, such as a high definition television (HDTV) and a liquid crystal display (LCD) TV. Because these appliance devices require independent data processing, there is a demand for multi-port memory devices having a serial I/O interface using a plurality of ports.

A conventional multi-port memory device having a serial I/O interface includes a processor for processing serial I/O signals, and a DRAM core for performing a parallel low-speed operation. The processor and the DRAM core are implemented on the same wafer, that is, a single chip.

FIG. 1 is a block diagram of a conventional multi-port memory device having a serial I/O interface. For convenience of explanation, the multi-port memory device having two ports and four banks is illustrated.

The multi-port memory device having the serial I/O interface includes serial I/O pads TX+, TX−, RX+ and RX−, first and second ports PORT0 and PORT1, first to fourth banks BANK0 to BANK3, and first and second global input/output (I/O) data buses GIO_IN and GIO_OUT.

The multi-port memory device has to be configured such that signals inputted through the first and second ports PORT0 and PORT1 (hereinafter, referred to as "input valid data signals") can be inputted to all banks BANK0 to BANK3, and signals outputted from the first to fourth banks BANK0 to BANK3 (hereinafter, referred to as "output valid data signals") can be selectively transferred to all ports PORT0 and PORT1.

For this purpose, the first and second ports PORT0 and PORT1 and the first to fourth banks BANK0 to BANK3 are connected together through the first and second global I/O data buses GIO_IN and GIO_OUT. The first and second global I/O data buses GIO_IN and GIO_OUT include input buses PRX0<0:3> and PRX1<0:3> for transferring the parallel input valid data signals from the first and second ports PORT0 and PORT1 to the first to fourth banks BANK0 to BANK3, and output buses PTX0<0:3> and PTX1<0:3> for transferring the parallel output valid data signals from the first to fourth banks BANK0 to BANK3 to the first and second ports PORT0 and PORT1.

The input valid data signals from the first and second ports PORT0 and PORT1 contain information on a bank selection signal for selecting a corresponding one of the first to fourth banks BANK0 to BANK3. Therefore, signals indicating which ports the signals access and which banks access through the ports are inputted to the first to fourth banks BANK0 to BANK3. Accordingly, the port information is selectively transferred to the banks and the bank information is transferred to the first and second ports PORT0 and PORT1 via the first and second global I/O data buses GIO_IN and GIO_OUT.

Each of the first and second ports PORT0 and PORT1 includes a serializer & deserializer (SERDES) converting signals inputted through the reception pads RX+ and RX− into the parallel input valid data signals as a low speed data communication scheme, and transfers them to a DRAM core of the first to fourth banks BANK0 to BANK3 via the input buses PRX0<0:3> and PRX1<0:3>, and also converts the parallel output valid data signals, which are outputted from the DRAM core of the first to fourth banks BANK0 to BANK3 via the output buses PTX0<0:3> and PTX1<0:3>, into the serial signals as a high speed data communication scheme, and outputs them to the transmission pads TX+ and TX−.

FIG. 2 is a block diagram of the first port PORT0 illustrated in FIG. 1. The second port PORT1 has the same structure as that of the first port PORT0, and thus the first port PORT0 will be described as an exemplary structure.

The first port PORT0 performs data communication with external devices through a serial I/O interface including transmission pads TX+ and TX−, and reception pads RX+ and RX−. Signals inputted through the reception pads PX+ and RX− are serial high-speed input signals, and the signals outputted through the transmission pads TX+ and TX− are serial high-speed output signals. Generally, the high-speed I/O signals include differential signals for recognizing the high-speed I/O signals smoothly. The differential I/O signals are distinguished by indicating the serial I/O interface TX+, TX−, RX+ and RX− with "+" and "−".

The first port PORT0 includes a driver 21, a serializer 22, an input latch 23, a clock generator 24, a sampler 25, a deserializer 26, and a data output unit 27.

The clock generator 24 receives a reference clock RCLK from an external device to generate an internal clock. The internal clock has period and phase equal to those of the reference clock RCLK, or period and/or phase different from those of the reference clock RCLK. Also, the clock generator 24 can generate one internal clock using the reference clock RCLK or can generate at least two internal clocks having different period and phase.

The input latch 23 latches the output valid data signals outputted via the output bus PTX0<0:3> from the banks in synchronization with the internal clock and transfers the latched signals to the serializer 22.

The serializer 22 serializes the parallel output valid data signals inputted from the input latch 23 in synchronization with the internal clock, and outputs the serial output valid data signals to the driver 21.

The driver 21 outputs the output valid data signals serialized by the serializer 22 to the external devices through the transmission pads TX+ and TX− in a differential type.

The sampler 25 samples external signals inputted from the external device through the reception pads RX+ and RX− in synchronization with the internal clock and transfers the sampled signals to the deserializer 26.

The deserializer 26 deserializes the external signals inputted from the sampler 25 in synchronization with the internal clock, and outputs the parallel input valid data signals to the data output unit 27.

The data output unit 27 transfers the input valid data signals from the deserializer 26 to the banks via the input bus PRX0<0:3>.

An operation characteristic of the first ports PORT0 will be described below in detail.

First, a process of transferring the external signals via the input bus PRX0<0:3> will be described. The external signals are inputted from the external devices through the reception pads RX+ and RX− in a frame form at high speed.

The external signals are sampled through the sampler 25 in synchronization with the internal clock outputted from the clock generator 24. The sampler 25 transfers the sampled external signals to the deserializer 26. The deserializer 26 deserializes the external signals inputted from the sampler 25 in synchronization with the internal clock, and outputs the deserialized signals as the parallel input valid data signal to the data output unit 27. The data output unit 27 transfers the parallel input valid data signal to the banks via the input bus PRX0<0:3>.

Next, a process of converting the parallel output valid data signals outputted via the output bus PTX0<0:3> into the serial signals and transferring them to the external devices through the transmission pads TX+ and TX− will be described below.

The parallel output valid data signals are transferred to the input latch 23 via the output bus PTX0<0:3>. The input latch 23 latches the output valid data signals in synchronization with the internal clock and transfers the latched signals to the serializer 22. The serializer 22 serializes the output valid data signals transferred from the input latch 23 in synchronization with the internal clock and transfers the serial signals to the driver 21. The driver 21 outputs the serial signals to the external devices through the transmission pads TX+ and TX−.

As described above, the conventional multi-port memory device is configured to perform the data communication with the external devices in the high-speed serial I/O interface. Accordingly, it transmits data at higher speed compared with the existing typical DRAM devices to guarantee a high-speed data processing.

In this case, a conventional test device for testing the typical DRAM device has a limitation in transferring and recognizing high-speed data signals. Accordingly, it is difficult to verify an operation of the multi-port memory device so that a test device for high-speed is required. However, since a large investment is required to introduce the test device for high-speed, the unit cost of production is increased and a competitiveness of the product is weakened accordingly.

SUMMARY OF THE INVENTION

It is, therefore, an object of the present invention to provide a multi-port memory device capable of performing high-speed test operation by using a test device for performing low-speed test operation in a parallel I/O interface.

In accordance with an aspect of the present invention, there is provided a multi-port memory device including: a plurality of serial I/O data pads; a plurality of parallel I/O data pads; a plurality of first ports for performing a serial I/O data communication with external devices through the serial I/O data pads; a plurality of banks for performing a parallel I/O data communication with the first ports via a plurality of first data buses; and a second port for performing a parallel I/O data communication with the external devices through the parallel I/O data pads and a serial I/O data communication with the first ports via a plurality of second data buses, during a test mode.

In accordance with another aspect of the present invention, there is provided a multi-port memory device including a plurality of serial I/O data pads; a plurality of first ports for performing a serial I/O data communication with external devices through the serial I/O data pads; a plurality of banks for performing a parallel I/O data communication with the first ports via a plurality of first data buses; and a second port for performing a parallel I/O data communication with the external devices through the serial I/O data pads and a serial I/O data communication with the first ports via a plurality of second data buses, during a test mode.

In accordance with further another aspect of the present invention, there is provided a multi-port memory device including a plurality of first ports for performing a serial I/O data communication with external devices; a plurality of banks for performing a parallel I/O data communication with the first ports via a plurality of global data buses; a second port, during a test mode, serializing test signals inputted in parallel through external pads to transfer the serialized test signals to the first ports, and deserializing test data signals inputted in series from the first ports to output the deserialized test data signals to the external devices through the external pads in response to the test signals.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a test interface of a multi-port memory device with a serial input/output (I/O) interface in accordance with exemplary embodiments of the present invention will be described in detail with reference to the accompanying drawings.

Figure 1:
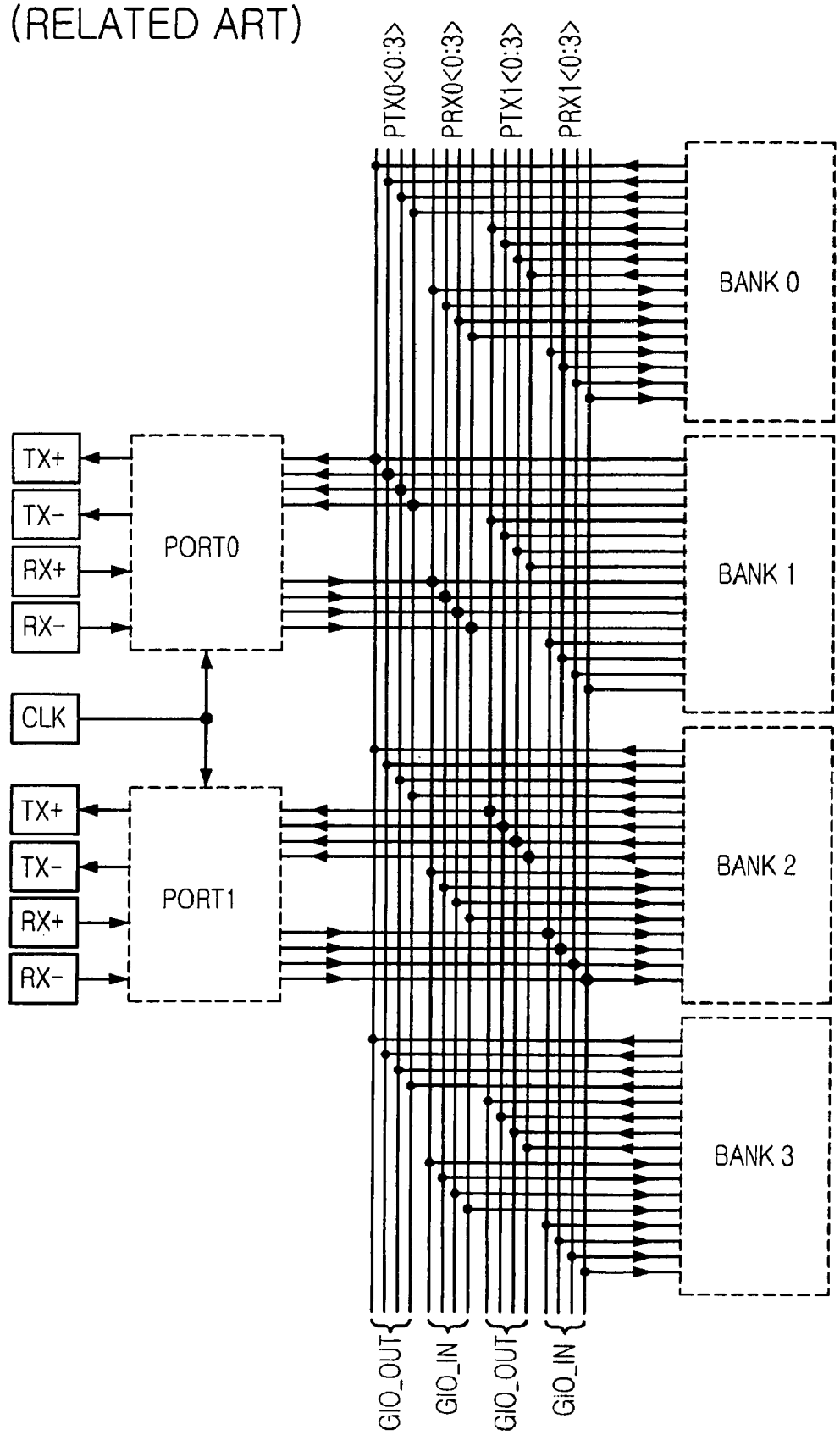
FIG. 1 is a block diagram of a conventional multi-port memory device.
Figure 2:
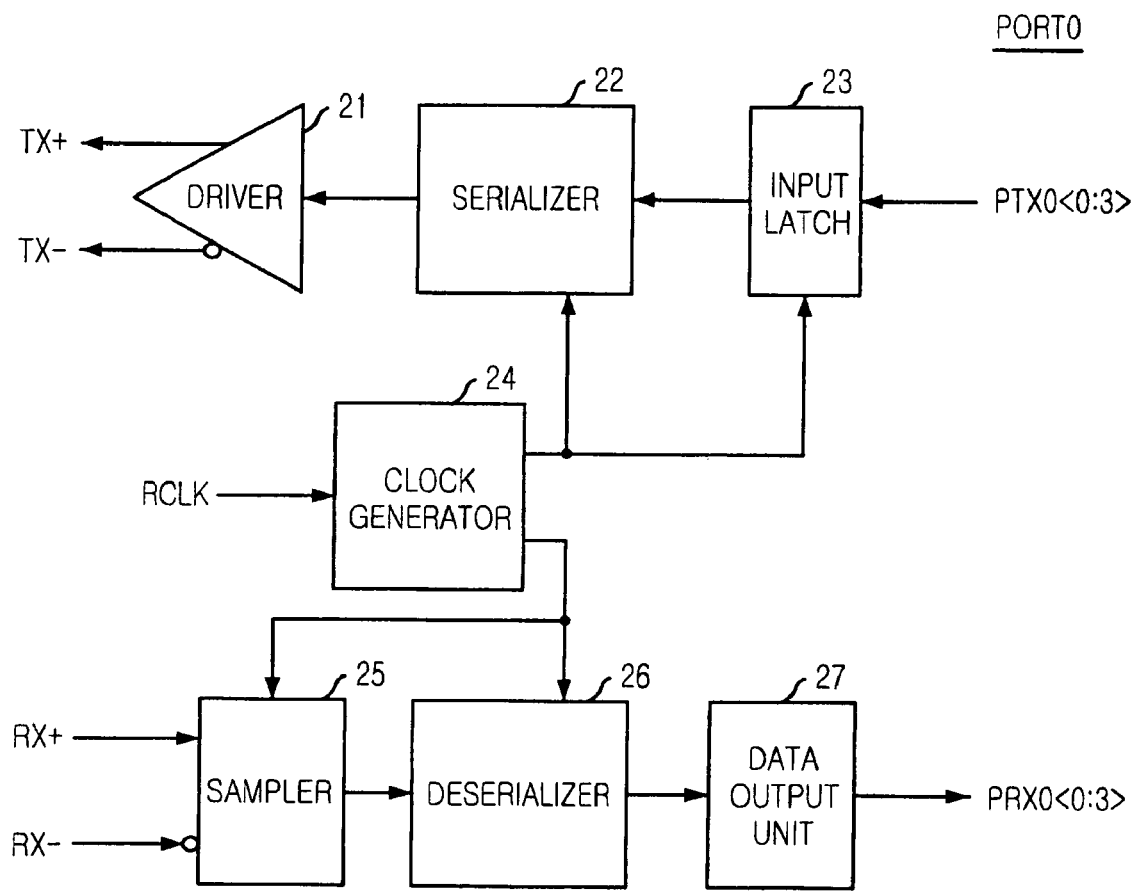
FIG. 2 is a block diagram of a first port illustrated in FIG. 1.
Figure 3:
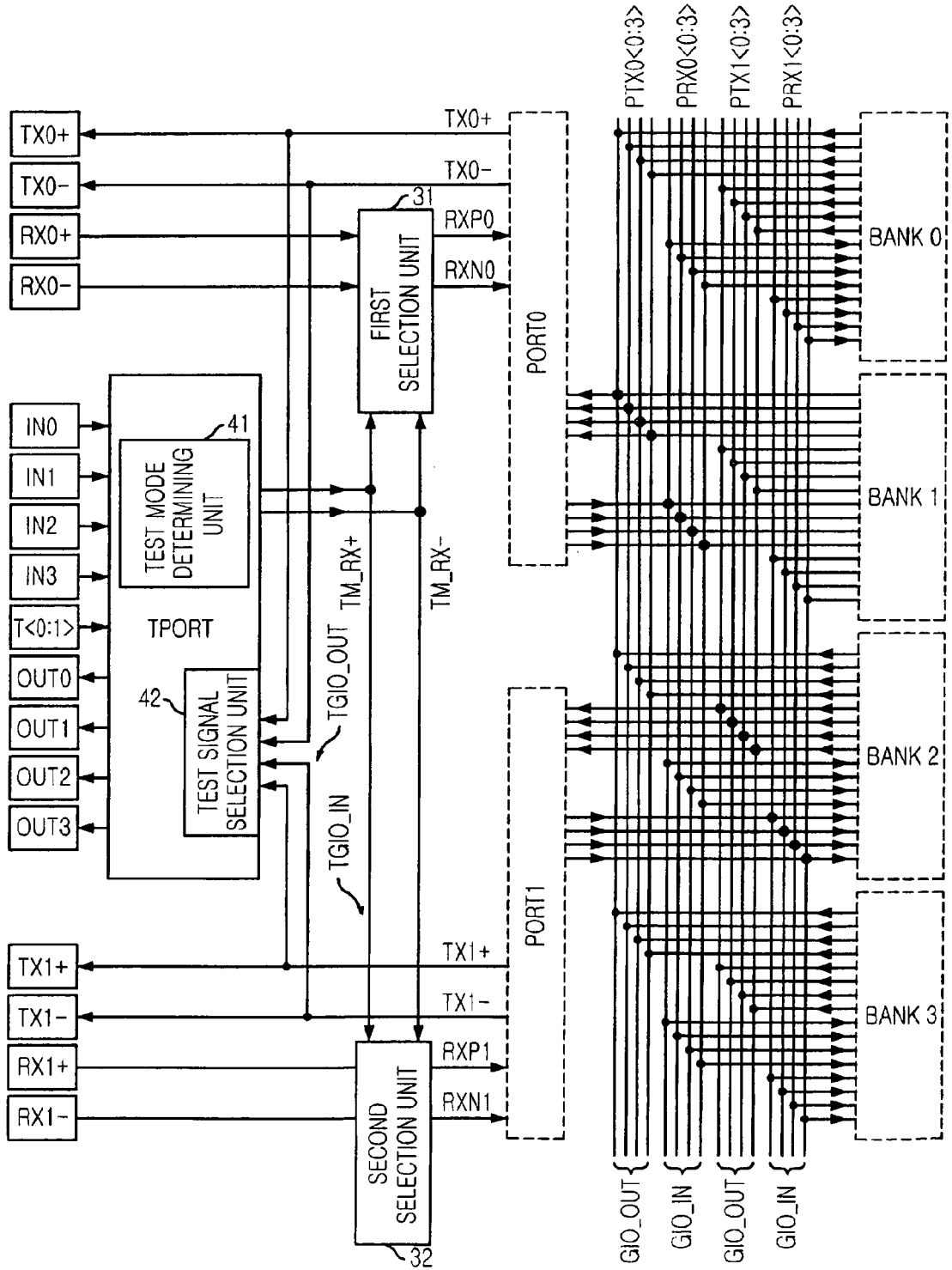
FIG. 3 is a block diagram of a multi-port memory device in accordance with a first embodiment of the present invention.

FIG. 3 is a block diagram of a multi-port memory device in accordance with a first embodiment of the present invention. For convenience of explanation, the multi-port memory device having two ports and four banks is illustrated.

The multi-port memory device includes a plurality of serial I/O pads TX0+, TX0−, TX1+, TX1−, RX0+, RX0−, RX1+ and RX1−, a plurality of parallel I/O pads IN<0:3>, T<0:1> and OUT<0:3>, a test port TPORT, first and second selection units 31 and 32, first and second ports PORT0 and PORT1, first to fourth banks BANK0 to BANK3, and first and second global input/output (I/O) data buses GIO_IN and GIO_OUT.

The plurality of serial I/O pads support data communication between the first and second ports PORT0 and PORT1 and external devices in high-speed serial I/O interface. The serial I/O pads include transmission pads such as TX0+, TX0−, TX1+ and TX1− and reception pads such as RX0+, RX0−, RX1+ and RX1−. The transmission pads TX0+, TX0−, TX1+ and TX1− transfer output valid data signals which are serialized and outputted from the first and second ports PORT0 and PORT1 to the external devices. The reception pads RX0+, RX0−, RX1+ and RX1− transfer input valid data signals inputted from the external devices to the first and second ports PORT0 and PORT1.

The plurality of parallel I/O pads includes test signal pads IN<0:3>, test mode control signal pads T<0:1>, and test data pads OUT<0:3>. The test signal pads IN<0:3> (Hereinafter, referred to as "first test reception pads") transfer test signals inputted from an external test device in parallel to the test port TPORT. The test mode control signal pads T<0:1> (Hereinafter, referred to as "second test reception pads") transfer test mode control signals inputted from the external test device in parallel to the test port TPORT. The test data pads OUT<0:3> (Hereinafter, referred to as "test transmission pads") transfer test data signals inputted from the test port TPORT in parallel to the external test device. Herein, the numbers of first test reception pads and test transmission pads may be adjusted according to the bit number of processing data during a normal operation. For convenience of explanation, a unit of processing data is set to 4-bit unit.

The test port TPORT determines whether a test mode is entered or not in response to the test mode control signals inputted through the second test reception pads T<0:1> in parallel, and determines which ports performs data communication with the banks BANK1 to BANK0 in response to the test signals inputted through the first test reception pads IN<0:3> in parallel. In addition, the test port TPORT transfers the test data signals outputted from the ports PORT0 and PORT1 to the test transmission pads OUT<0:3> during the test mode.

Figure 4:
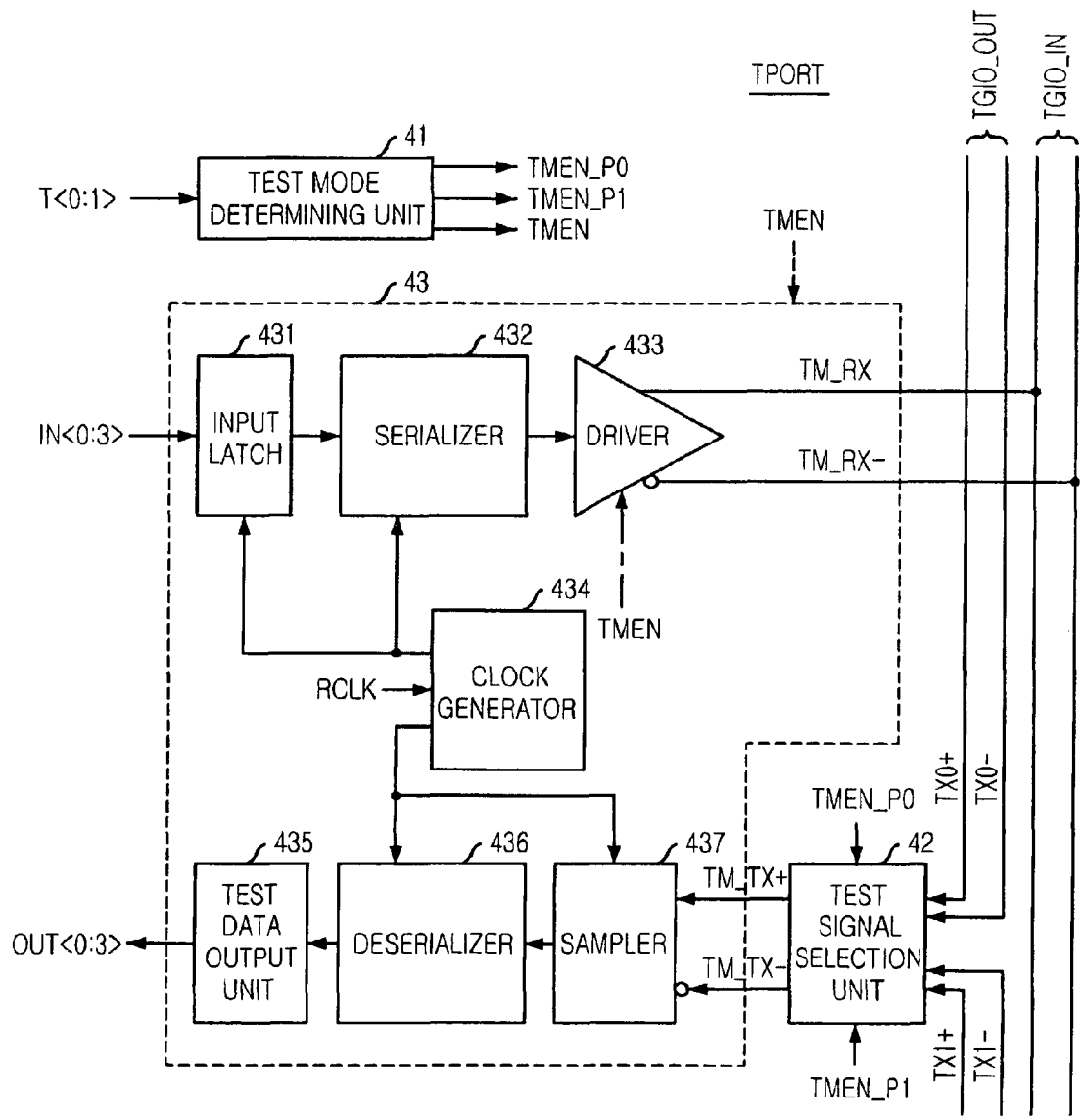
FIG. 4 is a circuit diagram of a test port illustrated in FIG. 3.

FIG. 4 is a circuit diagram of the test port TPORT illustrated in FIG. 3.

The test port TPORT includes a test mode determining unit 41, a test signal selection unit 42 and a serializer & deserializer (SERDES) 43.

The test mode determining unit 41 decodes the test mode control signals inputted through the second test reception pads T<0:1> in parallel and generates a test mode enable signal TMEN to determine an entry into the test mode in response to the test mode control signals. In addition, the test mode determining unit 41 generates first and second port selection signals TMEN_P0 and TMEN_P1 for selecting one of ports PORT0 and PORT1 based on the test mode control signals. The test mode enable signal TMEN may be generated by using the first and second port selection signals TMEN_P0 and TMEN_P1.

The SERDES 43 receives and serializes the test signals inputted through the first test reception pads IN<0:3> in parallel by 1-bit unit, thereby transferring serialized test signals TM_RX+ and TM_RX− to the ports PORT0 and PORT1 via a first test global data I/O bus TGIO_IN. In addition, the SERDES 43 receives and deserializes serialized test data signals TM_TX+ and TM_TX− inputted from the ports PORT0 and PORT1 via a second test global data I/O bus TGIO_OUT, thereby transferring deserialized test data signals to the test transmission pads OUT<0:3>.

In detail, the SERDES 43 includes an input latch, a serializer 432, 431a driver 433, a clock generator 434, a test data output unit 435, a deserializer 436, and a sampler 437.

The clock generator 434 receives a reference clock RCLK from the external device to generate an internal clock. The internal clock may include a phase locked loop (PLL) for generating a plurality of internal clocks having various periods or a predetermined phase difference, or a delay locked loop (DLL) for generating the internal clock by delaying the reference clock RCLK by a predetermined time.

The input latch 431 latches the test signals through the first test reception pads IN<0:3> in synchronization with the internal clock.

The serializer 432 serializes output signals of the input latch 431 in synchronization with the internal clock.

The driver 433 drives the serialized signals to the first test global data I/O bus TGIO_IN in a differential type. The driver 433 may be enabled by the test mode enable signal TMEN.

The sampler 437 samples the serialized test data signals TM_TX+ and TM_TX− selected by the test signal selection unit 42 in synchronization with the internal clock.

The deserializer 436 deserializes the sampled signal inputted from the sampler 437 in synchronization with the internal clock.

The test data output unit 435 transfers the deserialized signals from the deserializer 436 to the external test device through the test transmission pads OUT<0:3>.

The test signal selection unit 42 selects one of a first test data signal pair TX0+ and TX0− outputted from the first port PORT0, and a second test data signal pair TX1+ and TX1− outputted from the second port PORT1 via the second test global data I/O bus TGIO_OUT in response to the first and second port selection signals TMEN_P0 and TMEN_P1, thereby outputting the selected test data signal pair to the sampler 437.

Figure 5:
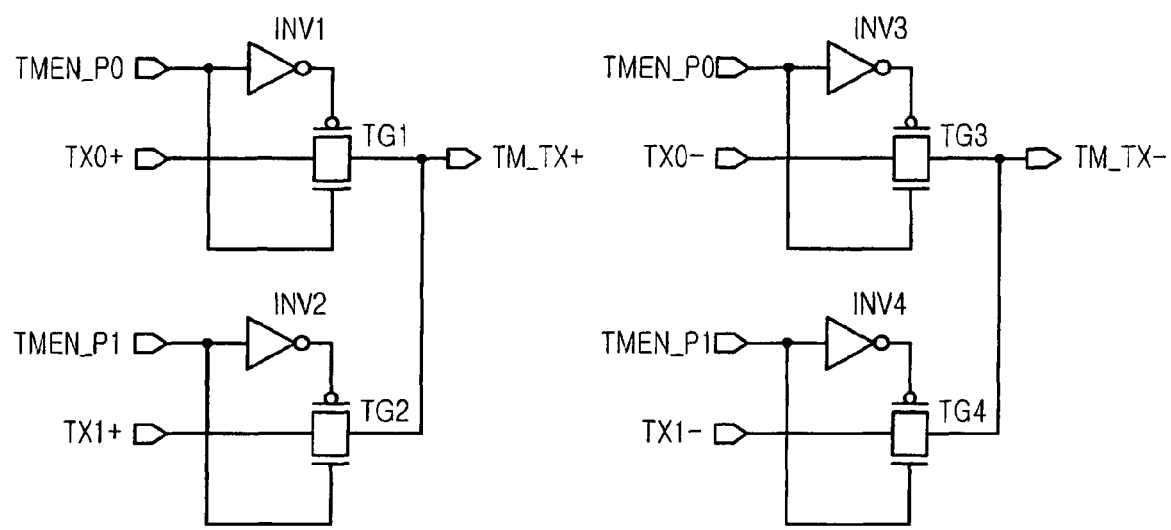
FIG. 5 is a circuit diagram of a test signal selection unit illustrated in FIG. 3.

FIG. 5 is a circuit diagram of the test signal selection unit 42 illustrated in FIG. 3.

The test signal selection unit 42 includes a plurality of inverters INV1, INV2, INV3 and INV4, a plurality of transfer gates TG1, TG2, TG3 and TG4 composed of PMOS transistors and NMOS transistors.

When the first port PORT0 is selected, the first port selection signal TMEN_P0 is activated with a logic level "HIGH" to thereby turn on the first and third transfer gates TG1 and TG3. Accordingly, the first test data signal pair TX0+ and TX0− outputted from the first port PORT0 is transferred to the sampler 437.

When the second port PORT1 is selected, the second port selection signal TMEN_P1 is activated with a logic level "HIGH" to thereby turn on the second and fourth transfer gates TG2 and TG4. Accordingly, the second test data signal pair TX1+ and TX1− outputted from the second port PORT1 is transferred to the sampler 437.

Figure 6:
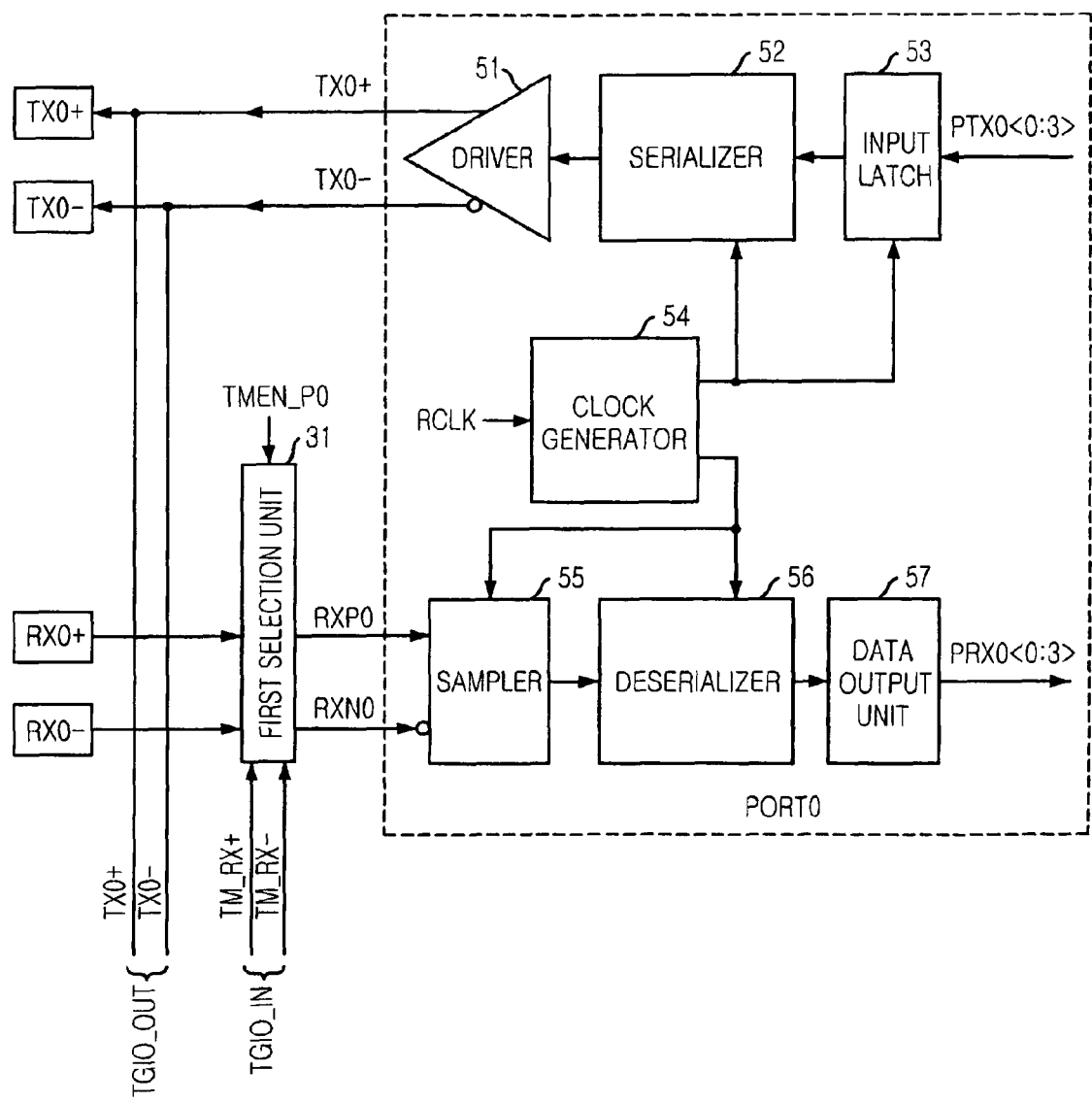
FIG. 6 is a circuit diagram of a first port illustrated in FIG. 3.

FIG. 6 is a circuit diagram of the first port PORT0 illustrated in FIG. 3.

The first selection unit 31 selects one of external signals inputted through the reception pads RX0+ and RX0− and the serialized test signals TM_RX+ and TM_RX− inputted via the first test global data I/O bus TGIO_IN in response to the first port selection signal TMEN_P0 outputted from the test mode determining unit 41, and outputs the selected signals as first reception signals RXP0 and RXN0 to the first port PORT0.

That is, in a normal mode, the external signals inputted through the reception pads RX0+ and RX0− are transferred to the first port PORT0. In a test mode, the serialized test signals TM_RX+ and TM_RX− inputted via the first test global data I/O bus TGIO_IN are transferred to the first port PORT0.

In detail, the first port PORT0 includes a driver 51, a serializer 52, an input latch 53, a clock generator 54, a sampler 55, a deserializer 56, and a data output unit 57.

The clock generator 54 receives the reference clock RCLK from an external device to generate an internal clock.

The input latch 53 latches the test data signals outputted from the banks through a first output bus PTX0<0:3> in synchronization with the internal clock.

The serializer 52 serializes output signals of the input latch 53 in synchronization with the internal clock.

The driver 51 drives the serialized signals to the external devices through the transmission pads TX0+ and TX0− in a differential type.

The sampler 55 samples the first reception signals RXP0 and RXN0 outputted from the first selection unit 31 in synchronization with the internal clock.

The deserializer 56 deserializes the sampled signal in synchronization with the internal clock.

The data output unit 57 transfers the deserialized signals from the deserializer 56 to a first data input bus PRX0<0:3>.

Figure 7:
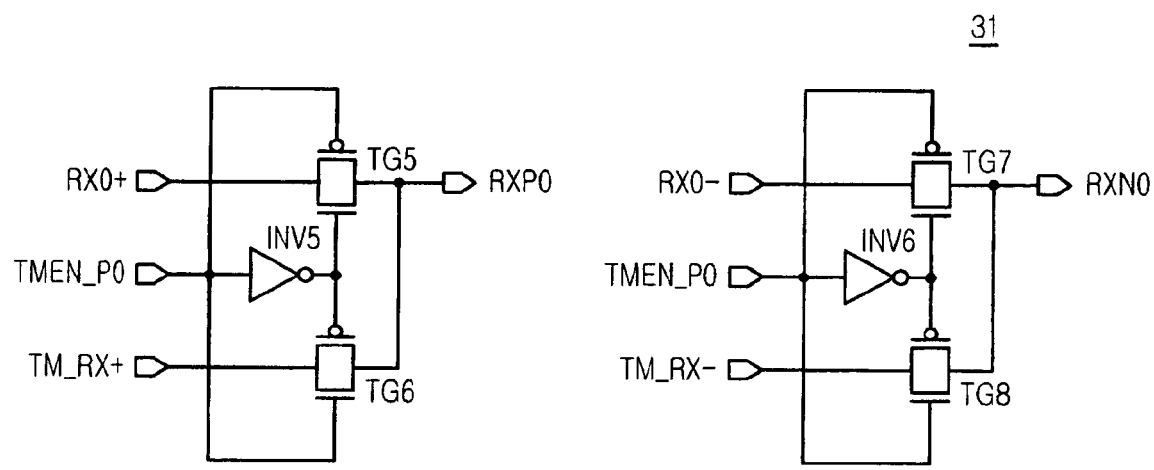
FIG. 7 is a circuit diagram of a first selection unit illustrated in FIG. 3.

FIG. 7 is a circuit diagram of the first selection unit 31 illustrated in FIG. 3.

The first selection unit 31 includes first and second inverters INV5 and INV6, and first to fourth transfer gates TG5, TG6, TG7 and TG8.

In a test mode, the first port selection signal TMEN_P0 is activated with a logic level "HIGH" so that the first and third transfer gates TG5 and TG7 are turned off and the second and fourth transfer gates TG6 and TG8 are turned on. As a result, the serialized test signals TM_RX+ and TM_RX− inputted via the first test global data I/O bus TGIO_IN are transferred to the first port PORT0. That is, the sampler 55 of the first port PORT0 receives the serialized test signals TM_RX+ and TM_RX− as the first reception signals RXP0 and RXN0.

In a normal mode, the first port selection signal TMEN_P0 is inactivated with a logic level "LOW" so that the second and fourth transfer gates TG6 and TG8 are turned off and the first and third transfer gates TG5 and TG7 are turned on. As a result, the external signals inputted through the reception pads RX0+ and RX0− are transferred to the first port PORT0. That is, the sampler 55 of the first port PORT0 receives the external signals inputted via the reception pads RX0+ and RX0− as the first reception signals RXP0 and RXN0.

Figure 8:
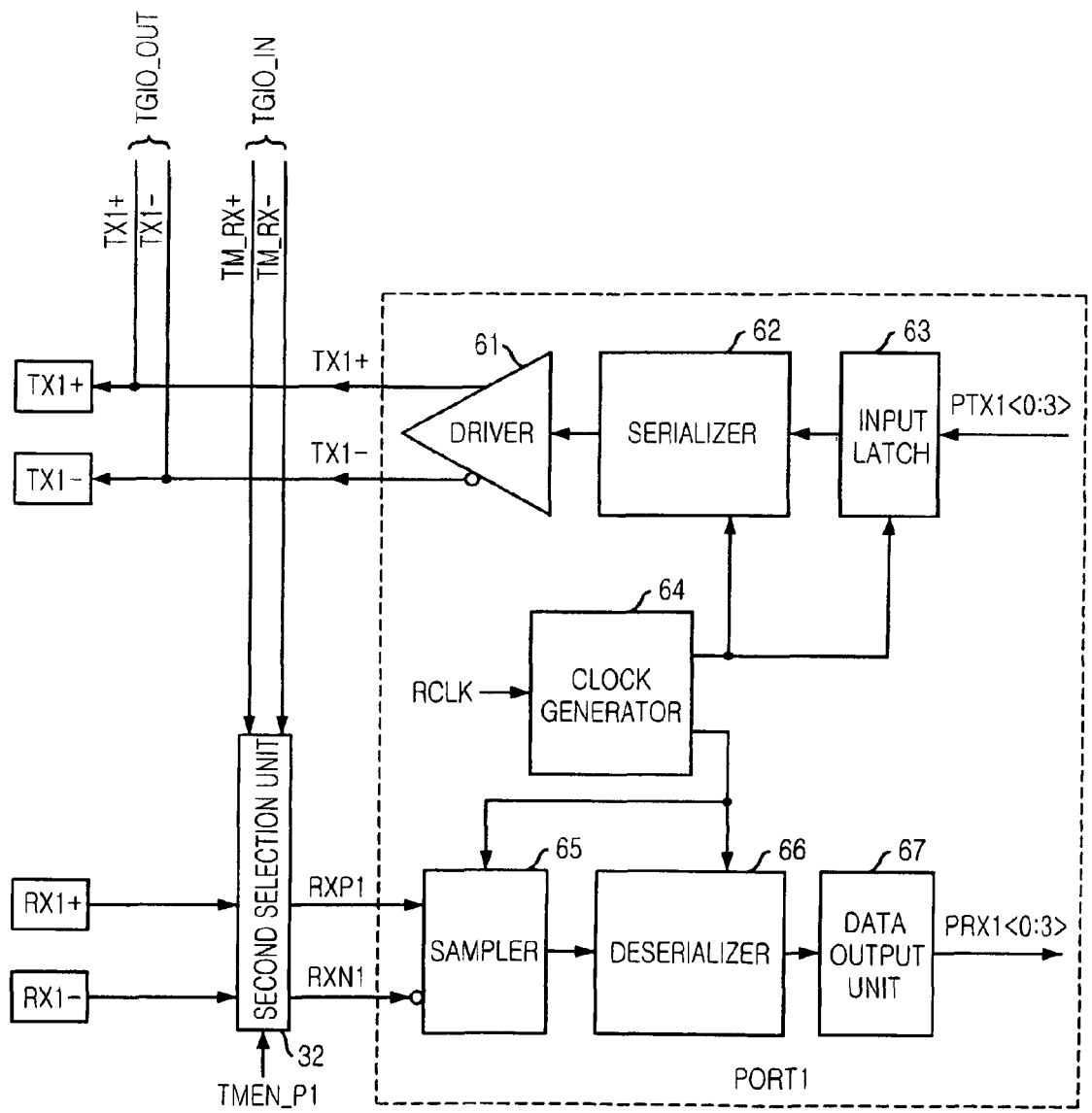
FIG. 8 is a circuit diagram of a second port illustrated in FIG. 3.

FIG. 8 is a circuit diagram of the second port PORT1 illustrated in FIG. 3.

The second selection unit 32 selects one of external signals inputted through the reception pads RX1+ and RX1− and the serialized test signals TM_RX+ and TM_RX− inputted via the first test global data I/O bus TGIO_IN in response to the second port selection signal TMEN_P1 outputted from the test mode determining unit 41, and outputs the selected signals as second reception signals RXP1 and RXN1 to the second port PORT1.

That is, in a normal mode, the external signals inputted via the reception pads RX1+ and RX1− are transferred to the second port PORT1. In a test mode, the serialized test signals TM_RX+ and TM_RX− inputted via the first test global data I/O bus TGIO_IN are transferred to the second port PORT1.

In detail, the second port PORT1 includes a driver 61, a serializer 62, an input latch 63, a clock generator 64, a sampler 65, a deserializer 66, and a data output unit 67. The second port PORT1 has the same structure as that of the first port PORT0, and thus the detailed descriptions are omitted.

Meanwhile, the above-mentioned clock generators 54, 64 and 434 of the first and second ports PORT0 and PORT1 and the test port TPORT, respectively, may be independent of each other, or may be shared in one chip in common.

Figure 9:
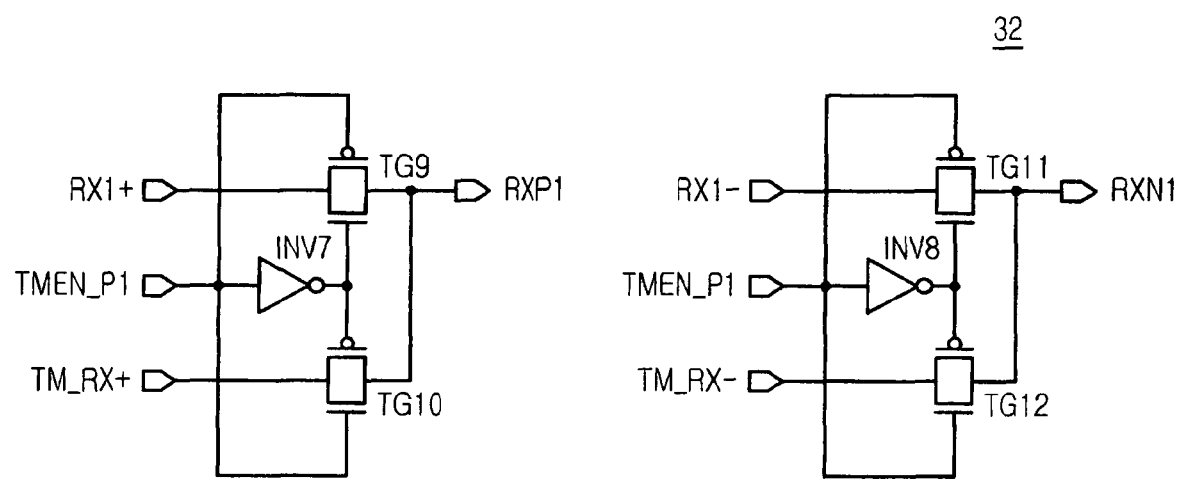
FIG. 9 is a circuit diagram of a second selection unit illustrated in FIG. 3.

FIG. 9 is a circuit diagram of the second selection unit 32 illustrated in FIG. 3.

The second selection unit 32 includes first and second inverters INV7 and INV8, and first to fourth transfer gates TG9, TG10, TG11 and TG12.

In a test mode, the second port selection signal TMEN_P1 is activated with a logic level "HIGH" so that the first and third transfer gates TG9 and TG11 are turned off and the second and fourth transfer gates TG10 and TG12 are turned on. As a result, the serialized test signals TM_RX+ and TM_RX− inputted via the first test global data I/O bus TGIO_IN are transferred to the second port PORT1. That is, the sampler 65 of the second port PORT1 receives the serialized test signals TM_RX+ and TM_RX− as the second reception signals RXP1 and RXN1.

In a normal mode, the second port selection signal TMEN_P1 is inactivated with a logic level "LOW" so that the second and fourth transfer gates TG10 and TG12 are turned off and the first and third transfer gates TG9 and TG11 are turned on. As a result, the external signals inputted through the reception pads RX1+ and RX1− are transferred to the second port PORT1. That is, the sampler 65 of the second port PORT1 receives the external signals inputted via the reception pads RX1+ and RX1− as the second reception signals RXP1 and RXN1.

Hereinafter, referring to FIGS. 3 to 9, an operation of the multi-port memory device in accordance with the first embodiment will be described in detail. For convenience of explanation, the unit of processing data is set to 4-bit unit.

If the second test mode control signals are inputted through the second test reception pads T<0:1>, the test mode determining unit 41 of the test port TPORT decodes the test mode control signals to determine an operating mode of the chip, i.e., one of the normal mode and the test mode.

First, if the operating mode of the chip is the normal mode, the SERDES 43 does not operate. Accordingly, the test signals inputted through the first test reception pads IN<0:3> are not transferred to the first test global data I/O bus TGIO_IN. On the other side, the first and second ports PORT0 and PORT1 perform a serial data communication with the external devices through the plurality of serial I/O pads TX0+, TX0−, TX1+, TX1−, RX0+, RX0−, RX1+ and RX1−.

Each of the first and second selection units 31 and 32 transfers the external signals inputted via the reception pads RX0+, RX0−, RX1+ and RX1− as the first and second reception signals RXP0, RXN0, RXP1 and RXN1 to the first and second ports PORT0 and PORT1, respectively.

Each sampler 55 and 65 of the first and second ports PORT0 and PORT1 samples the first and second reception signals RXP0, RXN0, RXP1 and RXN1 in synchronization with the internal clock. Each deserializer 56 and 66 deserializes the sampled signals in synchronization with the internal clock and outputs parallel signals to each data output unit 57 and 67 so as to transfer the parallel signals to the first global data I/O bus GIO_IN. If the unit of processing data is set to 4-bit unit, 4-bit data bus is allocated to each port PORT0 and PORT1.

The parallel signals applied to the first global data I/O bus GIO_IN are transferred to each bank and then they are transferred to a memory cell array of a DRAM core controlled by a bank control unit (not shown). At this time, because any one of the ports PORT0 and PORT1 may access banks BANK0 to BANK3, information for which bank the above deserialized signals are valid for is required. Therefore, the external signals inputted via the reception pads RX0+, RX0−, RX1+ and RX1− requires extra bits having information on a bank selection signal for selecting a corresponding one of the banks except for the unit of processing data, i.e., 4-bit. When the external signals including the bank selection signal are inputted, the first and second ports PORT1 and PORT2 decode the bank selection signal and transfer the bank selection signal to the bank control units via the first global data I/O bus GIO_IN. Each bank control unit determines whether the bank selection signal is valid for its bank or not. When the bank selection signal is valid, the other signals inputted via the first global data I/O bus GIO_IN are transferred to a corresponding bank.

Parallel cell data read from the memory cell array of the DRAM core in response to the bank selection signals are transferred to each port PORT0 and PORT1 via the second global data I/O bus GIO_OUT, and then are serialized by a corresponding port. As a result, the parallel cell data are transferred to the external devices through the transmission pads TX0+, TX0−, TX1+ and TX1−.

Next, if the operating mode of the chip is in the test mode, the test mode determining unit 41 activates one of the first and second port selection signals TMEN_P0 and TMEN_P1, and activates the test mode enable signal TMEN based on the test mode control signals. Accordingly, which port performs a parallel data communication with a corresponding bank via the first global data I/O bus GIO_IN is determined, and the test port TPORT operates.

For example, it is assumed that the first port selection signal TMEN_P0 is activated with a logic level "HIGH", i.e., the first port PORT0 is selected.

The SERDES 43 of the test port TPORT operates in response to the test mode enable signal TMEN. In detail, the input latch 431 latches the test signals through the first test reception pads IN<0:3> in synchronization with the internal clock. The serializer 432 serializes the output signals of the input latch 431 in synchronization with the internal clock, and outputs the serialized signals to the driver 433. The driver 433 drives the serialized signals as the serialized test signals TM_RX+ and TM_RX− to the first test global data I/O bus TGIO_IN in a differential type with a high speed.

The first selection unit 31 selects the serialized test signals TM_RX+ and TM_RX− in response to the first port selection signal TMEN_P0 and outputs the selected signals as the first reception signals RXP0 and RXN0 to the first port PORT0.

The sampler 55 of the first port PORT0 samples the first reception signals RXP0 and RXN0 in synchronization with the internal clock and transfers the sampled signals to the deserializer 56. The deserializer 56 deserializes the sampled signal in synchronization with the internal clock and outputs parallel signals to the data output unit 57. The data output unit 57 transfers the parallel signals as the test signals to the banks via the first global data I/O bus GIO_IN.

The test signals transferred to the banks are transferred to the memory cell array of the DRAM core controlled by the bank control unit. The parallel cell data read from the memory cell array of the DRAM core in response to the test signals are transferred to the first port PORT0 via the second global data I/O bus GIO_OUT. The first port PORT0 serializes the parallel cell data and transfers them as the first test data signal pair TX0+ and TX0− to the test signal selection unit 42 of the test port TPORT.

The test signal selection unit 42 selects the first test data signal pair TX0+ and TX0− outputted from the first port PORT0 in response to the first port selection signal TMEN_P0 activated with a logic level "HIGH" to thereby output them as the serialized test data signals TM_TX+ and TM_TX−. The sampler 437 of the SERDES 43 samples the serialized test data signals TM_TX+ and TM_TX− in synchronization with the internal clock and transfers the sampled signals to the deserializer 436. The deserializer 436 deserializes the sampled signal in synchronization with the internal clock and outputs the deserialized signals to the test data output unit 435. The test data output unit 435 transfers the deserialized signals to the external test device through the test transmission pads OUT<0:3>.

An operation that the second port selection signal TMEN_P1 is activated is the same as the operation that the second port selection signal TMEN_P1 is activated, except for an operation of the selection units 31, 32 and 42.

Figure 10:
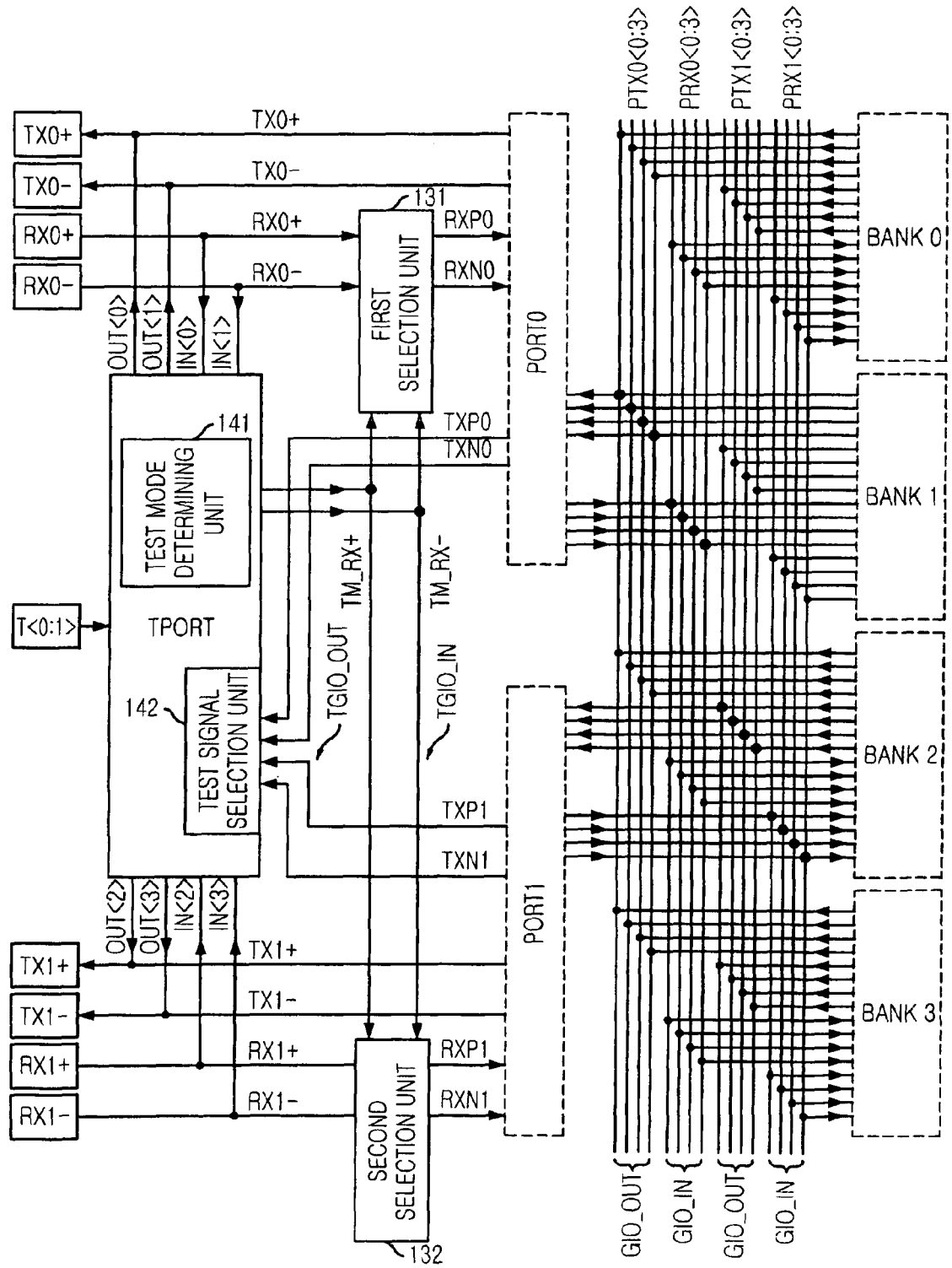
FIG. 10 is a block diagram of a multi-port memory device in accordance with a second embodiment of the present invention.

FIG. 10 is a block diagram of a multi-port memory device in accordance with a second embodiment of the present invention. The second embodiment may reduce the number of parallel I/O pads in comparison with the first embodiment.

Likewise the multi-port memory device in accordance with the first embodiment, the multi-port memory device in accordance with the second embodiment includes a plurality of serial I/O pads including transmission pads such as TX0+, TX0−, TX1+ and TX1− and reception pads such as RX0+, RX0−, RX1+ and RX1−, first to fourth banks BANK0 to BANK3, first and second ports PORT0 and PORT1, a test port TPORT, first and second selection units 31 and 32, and first and second global input/output (I/O) data buses GIO_IN and GIO_OUT. However, the multi-port memory device of the second embodiment only includes test reception pads T<0:1> and structures of the first and second ports PORT0 and PORT1 are changed accordingly.

In detail, the plurality of serial I/O pads TX0+, TX0−, TX1+, TX1−, RX0+, RX0−, RX1+ and RX1− are not used during a test mode, so as to be used as first test reception pads IN<0:3> and test transmission pads OUT<0:3>. That is, transmission pads TX0+, TX0−, TX1+ and TX1− are used as the test transmission pads OUT<0:3> and reception pads RX0+, RX0−, RX1+ and RX1− are used as the first test reception pads IN<0:3> during the test mode. Further, the structures of the first and second ports PORT0 and PORT1 need to be changed accordingly.

Figure 11:
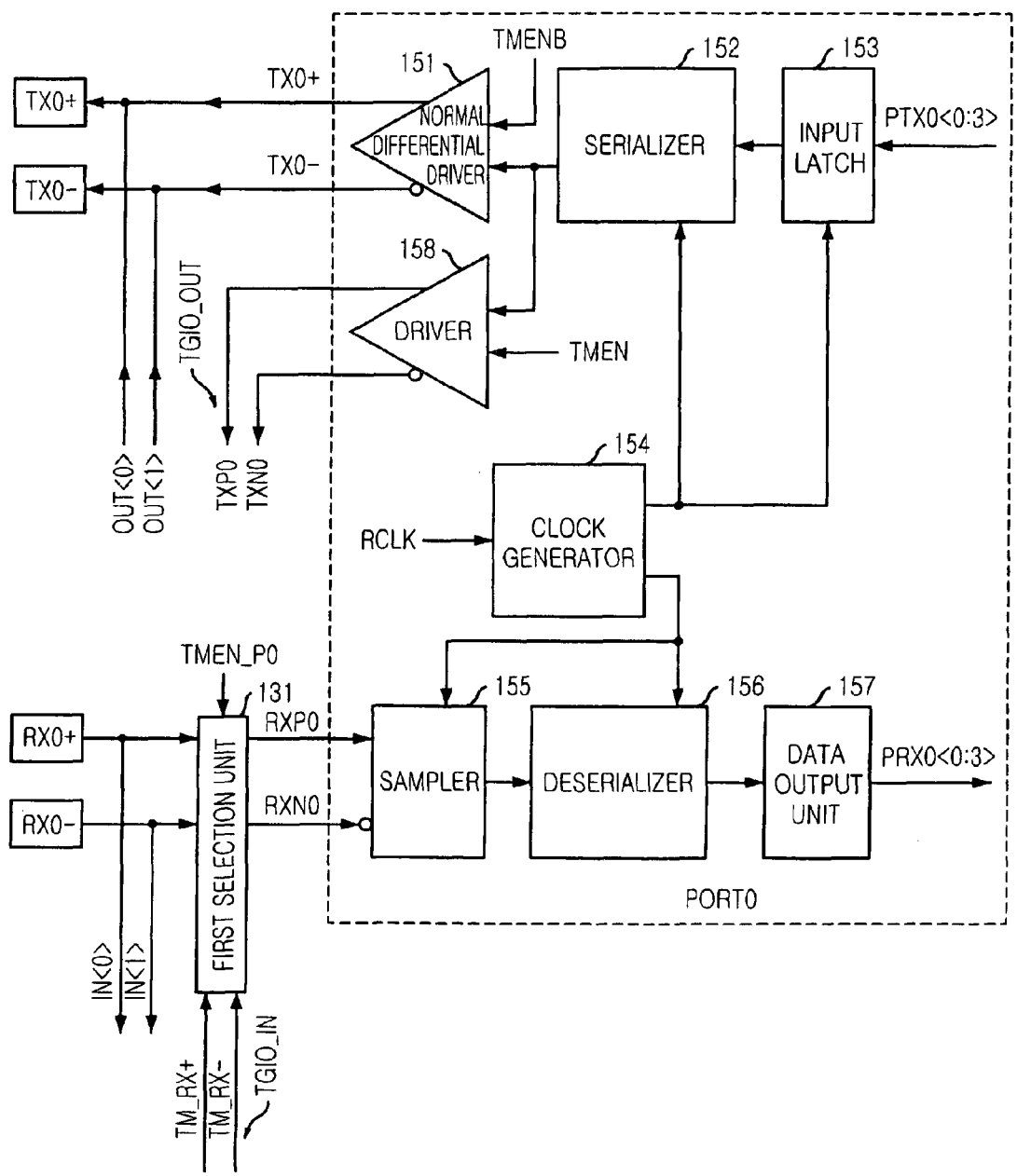
FIG. 11 is a circuit diagram of a first port illustrated in FIG. 10.

FIG. 11 is a circuit diagram of the first port PORT0 illustrated in FIG. 10.

The first port PORT0 of the second embodiment has the same structure as that of the first embodiment except that the first port PORT0 of the second embodiment includes two differential output drivers. In detail, likewise the first port PORT0 of the first embodiment shown in FIG. 6, the first port PORT0 of the second embodiment includes a normal differential driver 151, a serializer 152, an input latch 153, a clock generator 154, a sampler 155, a deserializer 156, and a data output unit 157. In addition, the first port PORT0 of the second embodiment further includes a test differential driver 158 for outputting cell data serialized and outputted by the serializer 152 to the test port TPORT during the test mode.

Test signals "TXP0" and "TXN0" shown in FIGS. 10 and 11 are cell data outputted from a bank during the test mode. The test signals "TXP0" and "TXN0" are the same signals as the first test data signal pair TX0+ and TX0− shown in FIGS. 4 to 7, and distinguished from output signals TX0+ and TX0− outputted from the normal differential driver 151 during a normal mode.

The test differential driver 158 operates in response to the test mode enable signal TMEN outputted from the test mode determining unit 41 shown in FIG. 4. That is, the test differential driver 158 operates during the test mode as the test mode enable signal TMEN is activated with a logic level "HIGH". On the other hand, the normal differential driver 151 operates in response to an inverted test mode enable signal TMENB. That is, the normal differential driver 151 becomes a high impedance state based on the inverted test mode enable signal TMENB with a logic level "LOW" so as not to transfer the cell data outputted by the serializer 152 to the external devices through the transmission pads TX0+ and TX0− during the test mode.

Figure 12:
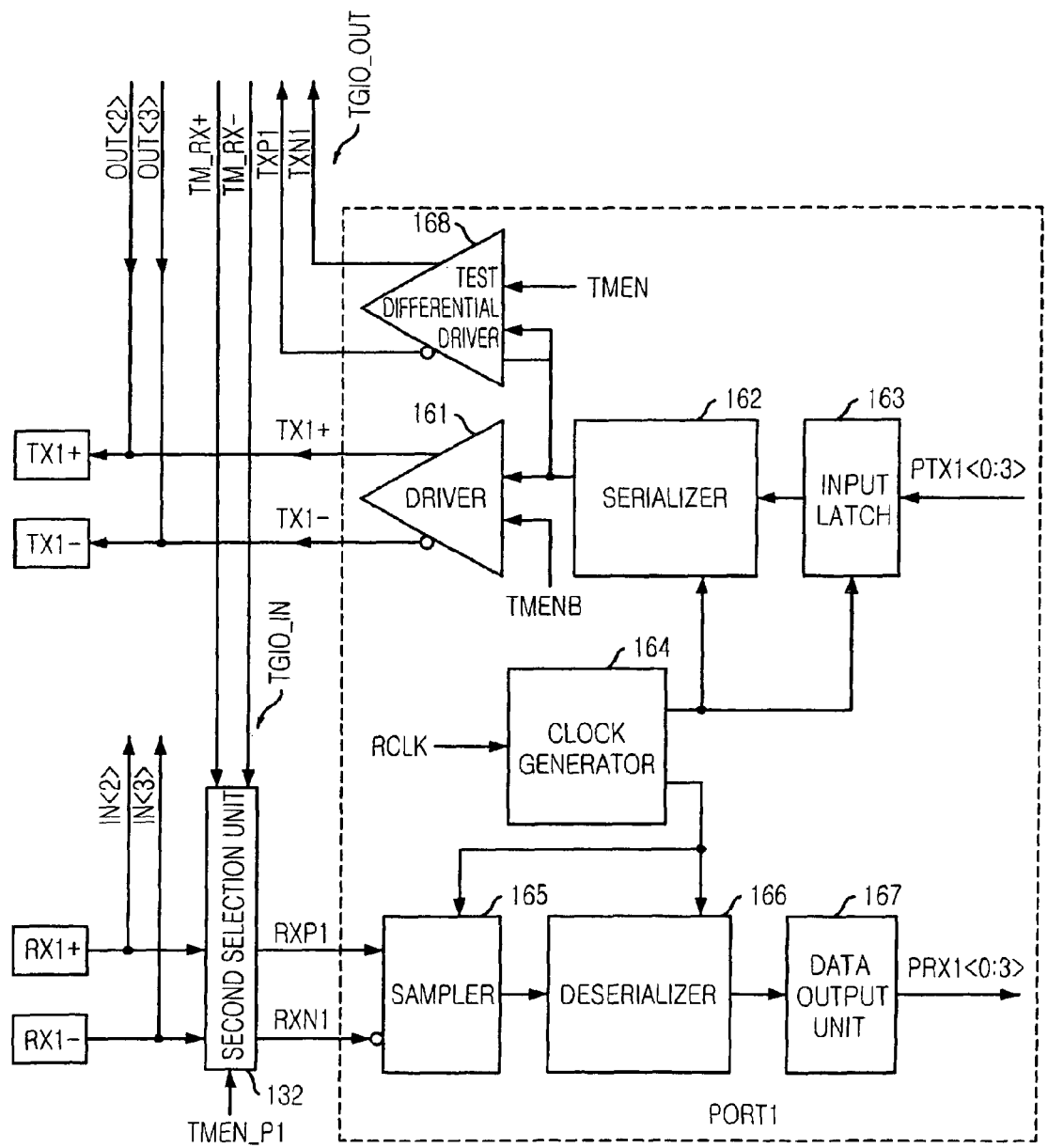
FIG. 12 is a circuit diagram of a second port illustrated in FIG. 10.

FIG. 12 is a circuit diagram of the second port PORT1 illustrated in FIG. 10.

The second port PORT1 of the second embodiment has the same structure as that of the first embodiment except that the second port PORT1 of the second embodiment includes two differential output drivers. In detail, the second port PORT1 of the second embodiment includes a normal differential driver 161, a serializer 162, an input latch 163, a clock generator 164, a sampler 165, a deserializer 166, and a data output unit 167. In addition, the first port PORT1 of the second embodiment further includes a test differential driver 168 for outputting cell data serialized and outputted by the serializer 162 to the test port TPORT during the test mode.

Test signals "TXP1" and "TXN1" shown in FIGS. 10 and 12 are cell data outputted from a bank during the test mode. The test signals "TXP1" and "TXN1" are the same signals as the second test data signal pair TX1+ and TX1− shown in FIGS. 4, 5, 8 and 9, and distinguished from output signals TX1+ and TX1− outputted from the normal differential driver 161 during a normal mode.

The test differential driver 168 operates in response to the test mode enable signal TMEN outputted from the test mode determining unit 41 shown in FIG. 4. That is, the test differential driver 168 operates during the test mode as the test mode enable signal TMEN is activated with a logic level "HIGH". On the other hand, the normal differential driver 161 operates in response to an inverted test mode enable signal TMENB. That is, the normal differential driver 161 becomes a high impedance state based on the inverted test mode enable signal TMENB with a logic level "LOW" so as not to transfer the cell data outputted by the serializer 162 to the transmission pads TX1+ and TX1− during the test mode.

Meanwhile, in accordance with the second embodiment, the test data output unit 435 of the test port TPORT shown in FIG. 4 includes an output driver which becomes a high impedance state during the normal mode so as not to transfer any signals to the transmission pads TX0+, TX0−, TX1+ and TX1−. Accordingly, the output driver may operate in response to the inverted test mode enable signal TMENB.

The first and second global I/O data buses GIO_IN and GIO_OUT shown in FIGS. 3 and 10 may include a latch for stably transferring signals between the ports and the banks.

For convenience of explanation, in the first and second embodiments of the present invention, the unit of processing data is set to 4-bit unit. Accordingly, the multi-port memory device of the first and second embodiments allocates four global I/O data buses per each port. Further, the multi-port memory device in accordance with the first embodiment includes four parallel I/O pads. However, the number of the global I/O data buses and the number of parallel I/O pads can be changed accordingly.

In accordance with the present invention, the multi-port memory device performing a data communication with external devices through serial I/O interfaces can test DRAM core without additional test devices for high-speed, thereby saving costs by using a test environment of the existing DRAM device.

Also, through a low-speed test, e.g., a wafer test, is performed, the multi-port memory device can internally operate at a high-speed, thereby being stably tested.

In accordance with the second embodiment of the present invention, an increase of the parallel I/O pads can be minimized during testing the DRAM core of the multi-port memory device at a high-speed.

The present application contains subject matter related to Korean patent application Nos. 2005-90916 & 2006-32947, filed in the Korean Intellectual Property Office on Sep. 29, 2005 and Apr. 11, 2006, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A multi-port memory device, comprising:
a plurality of first pads configured to transceive serial input/output (I/O) data with external devices;
a plurality of second pads configured to transceive parallel I/O data with the external devices;
a plurality of first ports configured to transceive serial I/O data with the first pads;
a plurality of banks configured to perform a parallel I/O data communication with the first ports; and
a second port configured to transceive parallel I/O data with the second pads and to perform a serial I/O data communication with the first ports by serializing the parallel I/O data, during a test mode;
wherein the second port serializes test signals inputted in parallel through the second pads and transfers the serialized test signals to the first ports via a plurality of second data buses during the test mode.

2. The multi-port memory device as recited in claim 1, wherein the banks performs the parallel I/O data communication with the first ports via a plurality of first data buses.

3. The multi-port memory device as recited in claim 2, wherein the test data signals are cell data outputted from a core of a bank corresponding to the serialized test signals inputted to the first ports.

4. The multi-port memory device as recited in claim 2, wherein the plurality of second pads include:
   a plurality of first reception pads for receiving the test signals in parallel;
   a plurality of second reception pads, each for receiving a test mode control signal for determining an entry into the test mode; and
   a plurality of first transmission pads for transmitting the deserialized test data signals in parallel.

5. The multi-port memory device as recited in claim 4, wherein the number of the first reception pads is the same as that of the first transmission pads.

6. The multi-port memory device as recited in claim 4, wherein the first data buses include:
   a plurality of input data buses for transferring the test signals from the first ports to the banks; and
   a plurality of output data buses for transferring the test data signals from the banks to the first ports.

7. The multi-port memory device as recited in claim 6, wherein the number of the input data buses is the same as that of the output data buses.

8. The multi-port memory device as recited in claim 6, wherein the numbers of the input and output data buses are the same as those of the first reception pads and the first transmission pads, respectively.

9. The multi-port memory device as recited in claim 4, wherein the second port includes:
   a test mode determining unit for generating a test mode enable signal based on the test mode control signals; and
   a serializer & deserializer (SERDES) for serializing the test signals to transfer the serialized test signals to the first ports via the second data buses, and deserializing the test data signals inputted from the first ports via the second data buses to transfer the deserialized test data signals to the first transmission pads.

10. The multi-port memory device as recited in claim 9, wherein the test mode determining unit generates a port selection signal for selecting one of the first ports based on the test mode control signals.

11. The multi-port memory device as recited in claim 10, wherein each of the second data buses includes:
    an input data bus for transferring the serialized test signals from the SERDES to the first ports; and
    an output data bus for transferring the test data signals from the first ports to the SERDES.

12. The multi-port memory device as recited in claim 11, further comprising a first selection unit for selecting one of the test data signals transferred via the output data bus in response to the port selection signal, and outputting the selected test data signal to the SERDES.

13. The multi-port memory device as recited in claim 12, wherein the first selection unit includes:
    an inversion unit for inverting the port selection signal and outputting an inverted port selection signal; and
    a plurality of transfer gates for transferring the test data signals to the SERDES in response to the inverted port selection signal.

14. The multi-port memory device as recited in claim 12, wherein the SERDES includes:
    an input latch for latching the test signals inputted through the first reception pads;
    a serializer for serializing and outputting the latched test signals;
    a driver for driving the serialized test signals to the second data buses;
    a sampler for sampling the serialized test data signals selected by the first selection unit;
    a deserializer for deserializing and outputting the sampled test data signal; and
    a data output unit for outputting the deserialized test data signals to the external devices through the test transmission pads.

15. The multi-port memory device as recited in claim 14, further comprising a clock generator for generating an internal clock for synchronizing input and output signals serialized and deserialized by the SERDES.

16. The multi-port memory device as recited in claim 15, wherein the clock generator generates the internal clock based on a reference clock from an external device.

17. The multi-port memory device as recited in claim 15, wherein the input latch, the serializer, the sampler, and the deserializer are synchronized with the internal clock.

18. The multi-port memory device as recited in claim 12, wherein the plurality of first pads include:
    a plurality of third reception pads for receiving external signals inputted in series during a normal mode; and
    a plurality of second transmission pads for transmitting signals outputted from the first ports in series during the normal mode.

19. The multi-port memory device as recited in claim 18, further comprising a second selection unit for selecting one of the external signals inputted through the third reception pads and the serialized test signals outputted from the SERDES in response to the port selection signal, and outputting the selected signal to a corresponding one of the first ports.

20. The multi-port memory device as recited in claim 19, wherein the second selection unit includes:
    an inversion unit for inverting the port selection signal and outputting an inverted port selection signal;
    a plurality of first transfer gates for transferring the external signals inputted through the third reception pads to the first ports in response to the inverted port selection signal; and
    a plurality of second transfer gates for transferring the serialized test signals outputted from the SERDES to the first ports in response to the port selection signal.

21. The multi-port memory device as recited in claim 19, wherein the first ports deserialized the selected signal inputted in series from the second selection unit to output the deserialized signals to the banks via the first data buses, and serialize signals inputted in parallel from the banks via the first data buses to output the serialized signal to the first pads.

22. The multi-port memory device as recited in claim 19, wherein each first port includes:
    a sampler for sampling the selected signal inputted in series from the second selection unit;
    a deserializer for deserializing and outputting the sampled signal;
    a data output unit for outputting the deserialized signals to the banks via a plurality of the first data buses;
    an input latch for latching signals inputted in parallel from the banks via the first data buses;
    a serializer for serializing and outputting the latched signals; and
    a driver for driving the serialized signal to the first pads.

23. The multi-port memory device as recited in claim 22, further comprising a clock generator for generating an internal clock for synchronizing input and output signals serialized and deserialized by the first ports.

24. The multi-port memory device as recited in claim 23, wherein the clock generator generates the internal clock based on a reference clock from an external device.

25. The multi-port memory device as recited in claim 23, wherein the input latch, the serializer, the sampler, and the deserializer are synchronized with the internal clock.

26. A multi-port memory device, comprising:
- a plurality of first pads for providing a serial input/output (I/O) data communication;
- a plurality of first ports for performing a serial I/O data communication with external devices through the first pads;
- a plurality of banks for performing a parallel I/O data communication with the first ports; and
- a second port configured to transceive parallel I/O data with the first pads and to perform a serial I/O data communication with the first ports by serializing the parallel I/O data, during a test mode,
- wherein, during the test mode, the second port serializes test signals inputted in parallel through the first pads, and transfers the serialized test signals to the first ports via a plurality of second data buses.

27. The multi-port memory device as recited in claim 26, wherein the first ports performs a serial I/O data communication with external devices through the first pads via a plurality of first data buses.

28. The multi-port memory device as recited in claim 27, wherein the test data signals are cell data outputted from a core of a bank corresponding to the serialized test signals inputted to the first ports.

29. The multi-port memory device as recited in claim 27, wherein the plurality of first pads include:
- a plurality of reception pads for receiving external signals inputted from the external devices in series or in parallel and transferring them to one of the first and second ports; and
- a plurality of transmission pads for transmitting signals outputted from the first ports in series or the second port in parallel to the external devices.

30. The multi-port memory device as recited in claim 29, wherein the number of the reception pads is the same as that of the transmission pads.

31. The multi-port memory device as recited in claim 29, wherein the first data buses include:
- a plurality of input data buses for transferring the test signals from the first ports to the banks; and
- a plurality of output data buses for transferring the test data signals from the banks to the first ports.

32. The multi-port memory device as recited in claim 31, wherein the number of the input data buses is the same as that of the output data buses.

33. The multi-port memory device as recited in claim 31, wherein the numbers of the input and output data buses are the same as those of the reception pads and the transmission pads, respectively.

34. The multi-port memory device as recited in claim 29, wherein the second port includes a serializer & deserializer (SERDES) for serializing the test signals inputted through the reception pads to transfer the serialized test signals to the first ports via the second data buses in response to a test mode enable signal activated during the test mode, and deserializing the test data signals inputted from the first ports via the second data buses to transfer the test data signals to the transmission pads.

35. The multi-port memory device as recited in claim 34, further comprising a plurality of second pads for receiving test mode control signals from an external device in parallel.

36. The multi-port memory device as recited in claim 35, the second port further includes a test mode determining unit for generating the test mode enable signal and a port selection signal for selecting one of the first ports based on the test mode control signals.

37. The multi-port memory device as recited in claim 36, wherein the second data buses include:
- an input data bus for transferring the serialized test signals from the SERDES to the first ports; and
- an output data bus for transferring the test data signals from the first ports to the SERDES.

38. The multi-port memory device as recited in claim 37, wherein the second port further includes a first selection unit for selecting one of the test data signals transferred via the output data bus in response to the port selection signal, and outputting the selected test data signal to the SERDES.

39. The multi-port memory device as recited in claim 38, wherein the first selection unit includes:
- an inversion unit for inverting the port selection signal and outputting an inverted port selection signal; and
- a plurality of transfer gates for transferring the test data signals to the SERDES in response to the inverted port selection signal.

40. The multi-port memory device as recited in claim 38, wherein the SERDES includes:
- an input latch for latching the test signals inputted through the reception pads;
- a serializer for serializing and outputting the latched test signals;
- a driver for driving the serialized test signals to the second data buses;
- a sampler for sampling the serialized test data signals selected by the first selection unit;
- a deserializer for deserializing and outputting the sampled test data signals; and
- a data output unit for outputting the deserialized test data signals to the external devices through the transmission pads.

41. The multi-port memory device as recited in claim 40, further comprising a clock generator for generating an internal clock for synchronizing input and output signals serialized and deserialized by the SERDES.

42. The multi-port memory device as recited in claim 41, wherein the clock generator generates the internal clock based on a reference clock from an external device.

43. The multi-port memory device as recited in claim 41, wherein the input latch, the serializer, the sampler, and the deserializer are synchronized with the internal clock.

44. The multi-port memory device as recited in claim 38, further comprising a second selection unit for selecting one of the external signals inputted through the reception pads and the serialized test signals outputted from the SERDES, and outputting the selected signal to one of the first and second ports in response to the port selection signal.

45. The multi-port memory device as recited in claim 44, wherein the second selection unit includes:
- an inversion unit for inverting the port selection signal and outputting an inverted port selection signal;
- a plurality of first transfer gates for transferring the external signals inputted through the reception pads to a corresponding one of the first ports in response to the inverted port selection signal; and
- a plurality of second transfer gates for transferring the serialized test signals outputted from the SERDES to a corresponding one of the first ports in response to the port selection signal.

46. The multi-port memory device as recited in claim 44, wherein the first ports deserialized the selected signal inputted in series from the second selection unit to output the deserialized signal to the banks via the first data buses, and serialize signals inputted in parallel from the banks via the first data buses to output the serialized signal to the first pads or the second port.

47. The multi-port memory device as recited in claim 46, wherein each first port includes:
- a sampler for sampling the selected signal inputted in series from the second selection unit;
- a deserializer for deserializing and outputting the sampled signal;
- a data output unit for outputting the deserialized signals to the banks via the first data buses in parallel;
- an input latch for latching signals inputted in parallel from the banks via the first data buses;
- a serializer for serializing and outputting the latched signals; and
- a driver for driving the serialized signal to the first pads.

48. The multi-port memory device as recited in claim 47, further comprising a clock generator for generating an internal clock for synchronizing input and output signals serialized and deserialized by the first ports.

49. The multi-port memory device as recited in claim 48, wherein the clock generator generates the internal clock based on a reference clock from an external device.

50. The multi-port memory device as recited in claim 48, wherein the input latch, the serializer, the sampler, and the deserializer are synchronized with the internal clock.

51. A multi-port memory device, comprising:
- at least one first port configured to transceive serial input/output (I/O) data with at least one external device;
- a second port configured to transceive parallel I/O data with the at least one external device and to perform serial I/O data communication with the at least one first port by serializing the parallel I/O data during a test mode; and
- at least one bank configured to perform a parallel I/O data communication with the at least one first port,
- wherein, during the test mode, the second port serializes test signals inputted in parallel through the at least one second pad, and transfers the serialized test signals to the at least one first port via at least one second data bus.

52. The multi-port memory device as recited in claim 51, wherein the at least one bank performs the parallel I/O data communication with the at least one first port via at least one first data bus.

53. The multi-port memory device as recited in claim 52, wherein the test data signals are cell data outputted from a core of a bank corresponding to the serialized test signals inputted to the at least one first port.

54. A multi-port memory device, comprising:
- at least one first port configured to transceive serial input/output (I/O) data with at least one external device;
- a second port configured to transceive parallel I/O data with the at least one external device and to perform a serial I/O data communication with the at least one first port by serializing the parallel I/O data during a test mode; and
- a plurality of banks configured to perform a parallel I/O data communication with the at least one first port,
- wherein, during the test mode the second port serializes test signals inputted in parallel through at least one first pad, and transfers the serialized test signals to the at least one first port via at least one second data bus.

55. The multi-port memory device as recited in claim 54, wherein the at least one first port performs a serial I/O data communication with external devices through the at least one first pad via at least one first data bus.

56. The multi-port memory device as recited in claim 55, wherein the test data signals are cell data outputted from a core of a bank corresponding to the serialized test signals inputted to the at least one first port.

57. The multi-port memory device as recited in claim 55, wherein the at least one first pad includes:
- at least one reception pad configured to receive external signals inputted from the at least one external device in series or in parallel and to transfer them to one of the first and second ports; and
- at least one transmission pad configured to transmit signals outputted from the at least one first port in series or the second port in parallel to the at least one external device.

* * * * *